United States Patent
Singh et al.

(10) Patent No.: US 7,257,800 B1
(45) Date of Patent: Aug. 14, 2007

(54) METHOD AND APPARATUS FOR PERFORMING LOGIC REPLICATION IN FIELD PROGRAMMABLE GATE ARRAYS

(75) Inventors: Deshanand Singh, Toronto (CA); Gabriel Quan, Toronto (CA); Terry Borer, Toronto (CA); Valavan Manohararajah, Scarborough (CA); Paul McHardy, Toronto (CA); Ivan Hamer, Toronto (CA); Karl Schabas, Toronto (CA); Kevin Chan, Scarborough (CA)

(73) Assignee: Altera Corporation, San Jose, CA (US)

(*) Notice: Subject to any disclaimer, the term of this patent is extended or adjusted under 35 U.S.C. 154(b) by 378 days.

(21) Appl. No.: 10/806,617

(22) Filed: Jun. 24, 2004

Related U.S. Application Data

(63) Continuation-in-part of application No. 10/617,502, filed on Jul. 11, 2003.

(60) Provisional application No. 60/486,619, filed on Jul. 11, 2003.

(51) Int. Cl.
*G06F 17/50* (2006.01)
*H03K 17/693* (2006.01)

(52) U.S. Cl. ........................................................ 716/16
(58) Field of Classification Search ................ 716/4, 716/16
See application file for complete search history.

(56) References Cited

U.S. PATENT DOCUMENTS

| | | | | |
|---|---|---|---|---|
| 5,396,435 A | * | 3/1995 | Ginetti ........................... | 716/6 |
| 5,475,830 A | * | 12/1995 | Chen et al. .................... | 716/16 |
| 5,696,693 A | * | 12/1997 | Aubel et al. ................... | 716/8 |
| 6,099,583 A | * | 8/2000 | Nag .............................. | 716/16 |
| 6,185,724 B1 | * | 2/2001 | Ochotta ......................... | 716/16 |
| 6,591,407 B1 | * | 7/2003 | Kaufman et al. .............. | 716/10 |

OTHER PUBLICATIONS

Beraudo et al., "Timing optimization of FPGA placements by logic replication", Design Automation Conference, 2003 Proceedings, pp. 196-201, Jun. 2-6, 2003.*

Mak et al., "Temporal logic replication for dynamically reconfigurable FPGA partitioning", IEEE Transactions on □□Computer-Aided Design of Integrated Circuits and Systems, pp. 952-959, Jul. 2003.*

* cited by examiner

*Primary Examiner*—Jack Chiang
*Assistant Examiner*—Brandon Bowers
(74) *Attorney, Agent, or Firm*—L. Cho

(57) ABSTRACT

A method for designing a system on a target device utilizing field programmable gate arrays is disclosed. A design is synthesized for the system. Components in the design are mapped onto resources on the target device. Placement locations are determined for the components on the target device. Components to replicate are identified in response to criticality determined from the placement locations.

34 Claims, 13 Drawing Sheets

METHOD AND APPARATUS FOR PERFORMING LOGIC REPLICATION IN FIELD PROGRAMMABLE GATE ARRAYS

RELATED APPLICATION

This application is a continuation-in-part, and claims the benefit of co-pending U.S. application Ser. No. 10/617,502 filed on Jul. 11, 2003 entitled "Method and Apparatus for Performing Incremental Placement for Layout-Driven Optimizations on Field Programmable Gate Arrays" under 35 U.S.C., §120, and U.S. Provisional Application 60/486,619 filed on Jul. 11, 2003 entitled "Method and Apparatus for Performing Logic Replication in Field Programmable Gate Arrays" under 35 U.S.C. §119(e).

FIELD OF THE INVENTION

The present invention relates to the field of field programmable gate arrays (FPGAs). More specifically, the present invention relates to a method and apparatus for performing targeted logic replication for timing driven FPGAs using tools such as electronic design automation (EDA) tools.

BACKGROUND

FPGAs may be used to implement large systems that include millions of gates and megabits of embedded memory. Of the tasks required in managing and optimizing a design, placement of components on the FPGAs and routing connections between components on the FPGA utilizing available resources can be the most challenging and time consuming. In order to satisfy placement and timing specifications, several iterations are often required to determine how components are to be placed on the target device and which routing resources to allocate to the components. The complexity of large systems often requires the use of EDA tools to manage and optimize their design onto physical target devices. Automated placement and routing algorithms in EDA tools perform the time consuming task of placement and routing of components onto physical devices.

The design of a system is often impacted by the connection delays routed along the programmable interconnect of the target device. The interconnect provides the ability to implement arbitrary connections, however, it includes both highly capacitive and resistive elements. The delay experienced by a connection is affected by the number of routing elements used to route the connection. Traditional approaches for reducing the delay were targeted at improving the automated placement algorithms in the EDA tools. Although some reductions in delay were achieved with these approaches, the approaches were not able to perform further improvements to the system after the placement phase. It is often only after the placement phase of the FPGA computer automated design (CAD) flow when connection delays are fully known.

Thus, what is needed is an efficient method and apparatus for performing layout-driven optimizations on FPGAs after the placement phase of the FPGA CAD flow.

SUMMARY

According to an embodiment of the present invention, logic replication is utilized to generate a duplicate of a component. The duplicate is used to reduce the length of a critical path associated with the component without significantly affecting the length of other paths in the system. Logic replication includes making an identical copy of a component, which may include a combination of a LUT and a register, on a critical or near-critical path. The duplicate is placed in a determined location that improves the overall slack of the system.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

Figure 1:
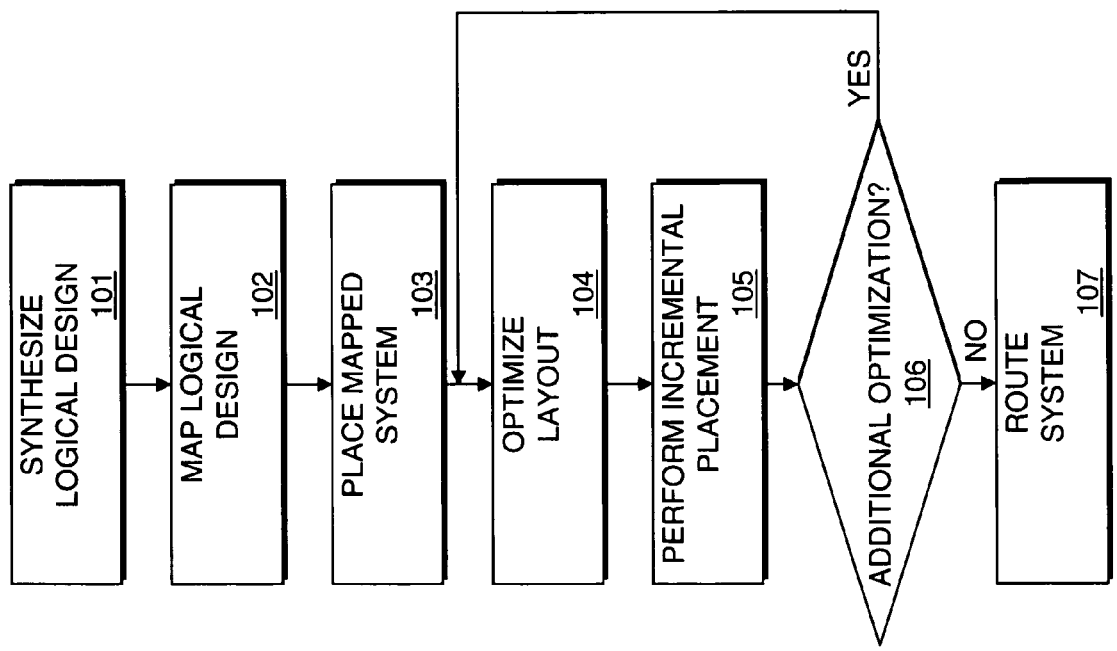
FIG. 1 is a flow chart illustrating a method for designing a system according to an embodiment of the present invention.

FIG. 1 is a flow chart that illustrates a method for designing a system according to an embodiment of the present invention. The method may be performed with the assistance of an EDA tool, for example. At 101, synthesis is performed. Synthesis includes generating a logic design of the system to be implemented by a target device. According to an embodiment of the present invention, synthesis generates an optimized logical representation of the system from a Hardware Description Language (HDL) design definition. The optimized logical representation of the system may include a representation that includes a minimized number of logic gates and logic elements required for the system. Alternatively, the optimized logical representation of the system may include a representation that has a reduced depth of logic and that generates a lower signal propagation delay.

Figure 2:
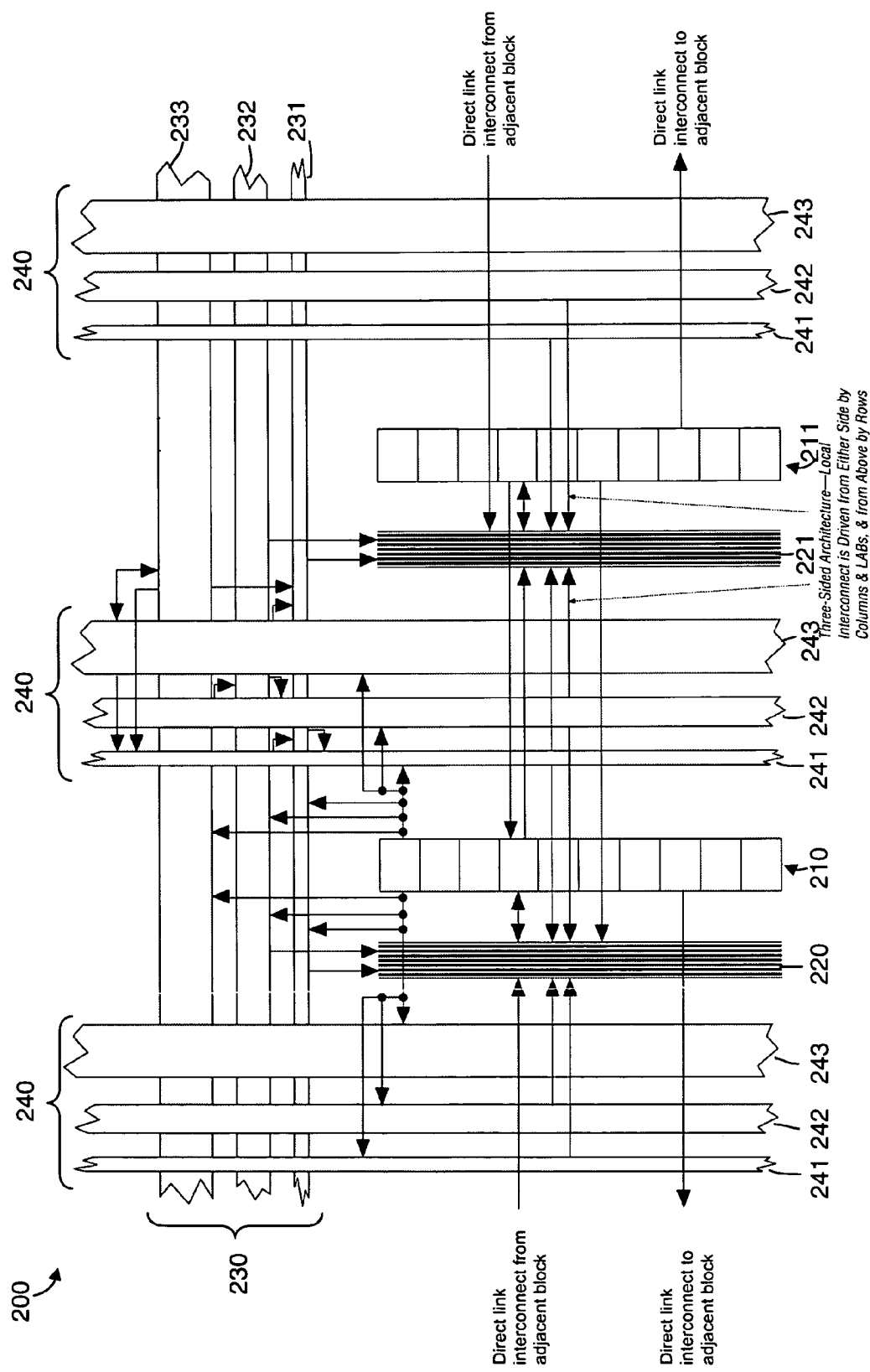
FIG. 2 illustrates a target device utilizing FPGAs according to an embodiment of the present invention.

FIG. 2 illustrates an exemplary target device 200 utilizing FPGAs according to an embodiment of the present invention. The present invention may be used to design a system onto the target device 200. According to one embodiment, the target device 200 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the target device 200, an LE may include a 4-input lookup table (LUT) with a configurable flip-flop.

The target device 200 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 200. A first column of LABs is shown as 210 and a second column of LABs is shown as 211.

The target device 200 includes memory blocks (not shown). The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200.

The target device 200 includes digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the target device 200.

The target device 200 includes a plurality of input/output elements (IOEs) (not shown). Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals. When used with dedicated clocks, the registers provide performance and interface support with external memory devices.

The target device 200 includes LAB local interconnect lines 220-221 that transfer signals between LEs in the same LAB. The LAB local interconnect lines are driven by column and row interconnects and LE outputs within the same LAB. Neighboring LABs, memory blocks, or DSP blocks may also drive the LAB local interconnect lines 220-221 through direct link connections.

The target device 200 also includes a plurality of row interconnect lines ("H-type wires") 230 that span fixed distances. Dedicated row interconnect lines 230, that include H4 231, H8 232, and H24 233 interconnects, route signals to and from LABs, DSP blocks, and memory blocks within the same row. The H4 231, H8 232, and H2 233 interconnects span a distance of up to four, eight, and twenty-four LABs respectively, and are used for fast row connections in a four-LAB, eight-LAB, and twenty-four-LAB region. The row interconnects 230 may drive and be driven by LABs, DSP blocks, RAM blocks, and horizontal IOEs.

The target device 200 also includes a plurality of column interconnect lines ("V-type wires") 240 that operate similarly to the row interconnect lines 230. The column interconnect lines 240 vertically routes signals to and from LABs, memory blocks, DSP blocks, and IOEs. Each column of LABs is served by a dedicated column interconnect, which vertically routes signals to and from LABs, memory blocks, DSP blocks, and IOEs. These column interconnect lines 240 include V4 241, V8 242, and V16 243 interconnects that traverse a distance of four, eight, and sixteen blocks respectively, in a vertical direction.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include components other than those described in reference to the target device 200. Thus, while the invention described herein may be utilized on the architecture described in FIG. 2, it should be appreciated that it may also be utilized on different architectures, such as those employed by Altera® Corporation in its APEX™, and Mercury™ family of chips and those employed by Xilinx®, Inc. in its Virtex™ and Virtex™ II line of chips.

Figure 3:
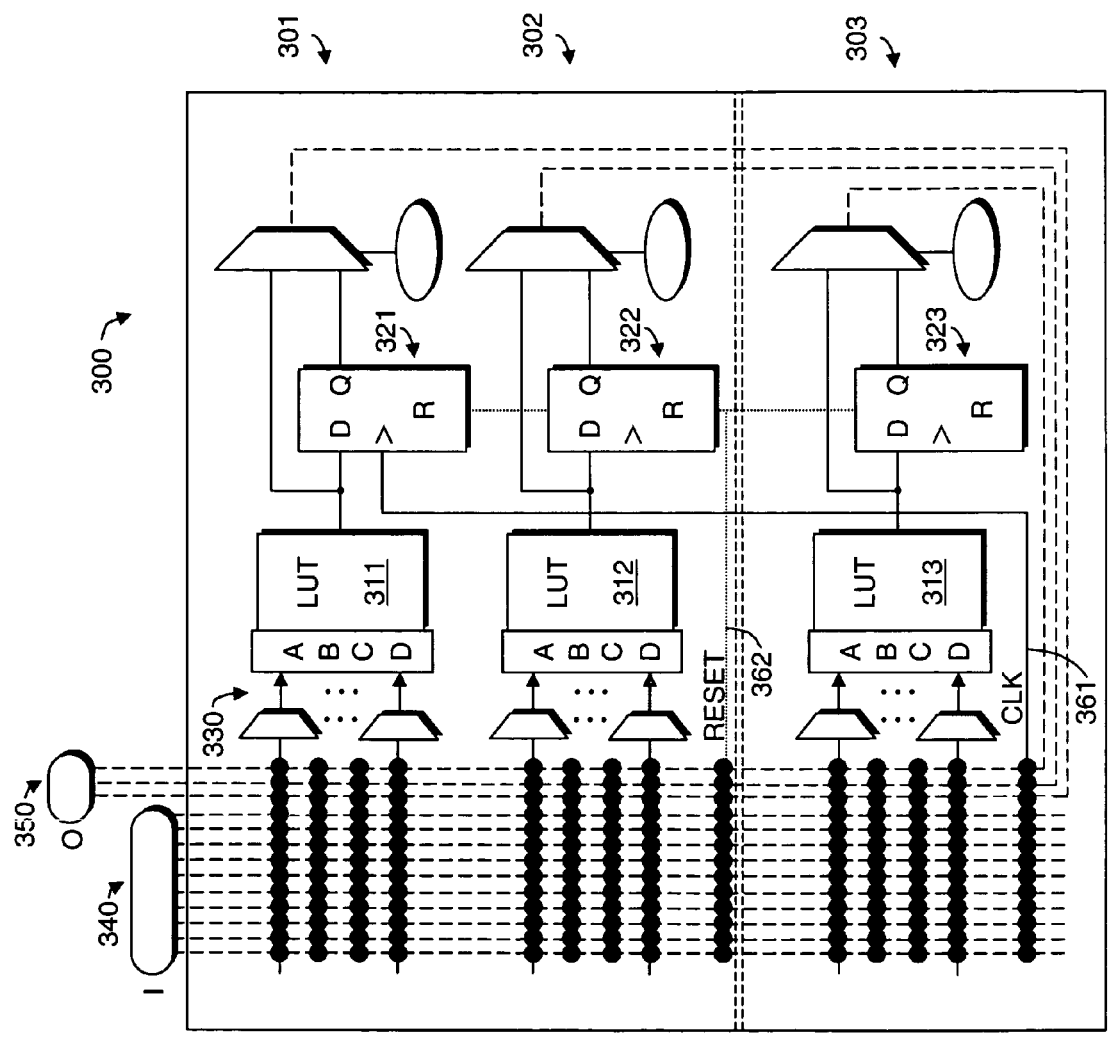
FIG. 3 illustrates a LAB according to an embodiment of the present invention.

FIG. 3 illustrates a LAB or clustered logic block 300 according to an embodiment of the present invention. The LAB 300 may be used to implement any of the LABs shown in FIG. 2. LEs 301-303 illustrates a first, second, and tenth LE in the LAB 300. The LEs 301-303 each have a 4-input lookup table 311-313, respectively, and a configurable register 321-323s, respectively, connected at its output. The LAB 300 includes a set of input pins 340 and a set of output pins 350 that connect to the general-purpose routing fabric so that LAB can communicate with other LABs. The inputs to lookup tables 311-313 can connect to any one of the input pins 340 and output pins 350 using the appropriate configuration bits for each of the multiplexers 330. The number of LEs, $n_E$, input pins, $n_I$, and output pins, no in a LAB impose important architectural constraints on a system. In addition, since a single clock line 361 and a single asynchronous set/reset line 362 is attached to each configurable register 321-323, the configurable registers 321-323 must be clocked by the same signal and initialized by the same signal. The number of clock lines available in a LAB is represented by $n_C$. The number of reset lines available in a LAB is represented by $n_R$.

Referring back to FIG. 1, at 102, the optimized logical design of the signal is mapped. Mapping includes determining how to implement components such as logic gates and logic elements in the optimized logic representation with specific resources on a target device. According to an embodiment of the present invention, a netlist is generated from mapping. The netlist illustrates how the resources of the target device are utilized to implement the system. The netlist may, for example, include a representation of the components on the target device and how the components are connected.

At 103, the mapped logical system design is placed. Placement includes fitting the system on the target device by determining which resources on the target device are to be used for specific logic gates, logic elements, and connections between components. The placement procedure may be performed by a placer in an EDA tool that utilizes placement algorithms. According to an embodiment of the present invention, a user (designer) may provide input to the placer by specifying placement constraints. The constraints may include defining logic regions that group certain components of a system together. The components may be for example, digital logic, memory devices, or other components. The size of the logic regions may be determined by the user or by a sizing method. The placement of the logic regions may be determined by the user or by a placement method.

At 104, layout-driven optimizations are performed. According to an embodiment of the present invention, routing delays for the connections on the netlist are estimated by calculating a fastest possible route. Timing-driven netlist optimization techniques may be applied to perturb the netlist to reduce the critical path(s). The netlist may be perturbed by the EDA tool performing the synthesis, mapping and placement. Alternatively, the netlist may be perturbed by a user of the EDA tool, or by a third party. Perturbing the netlist may include adding, deleting, or moving components. According to an embodiment of the present invention, preferred locations are identified for the components that have been added or moved from the layout-driven optimization. The locations assigned to components of the existing system from the placement procedure are identified as preferred locations for the components.

According to an embodiment of the present invention, layout-driven optimizations includes duplicating a component having a specific LUT and/or register that results in reducing a length of a critical path without significantly affecting the lengths of other paths in the circuit. The system design is altered such that a component on the critical path is copied and relocated to reduce the delay along the critical path. The delay reduction on the critical path results in an increase of the maximum frequency at which the system can operate.

Figure 4:
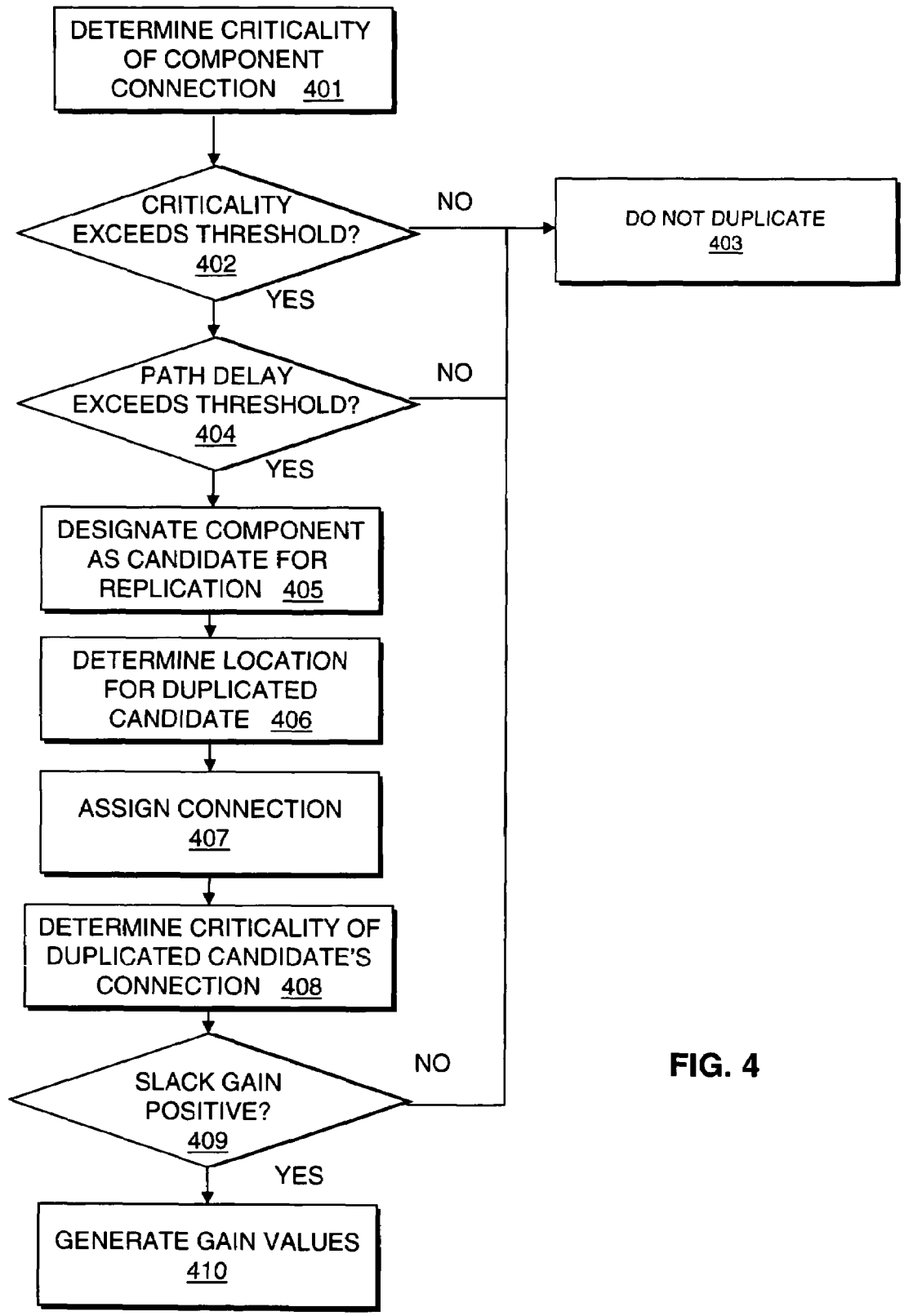
FIG. 4 is a flow chart illustrating a method for performing targeted logic replication for timing driven optimization according to an embodiment of the present invention.

FIG. 4 is a flow chart illustrating a method for performing targeted logic replication for timing driven optimization according to an embodiment of the present invention. According to one embodiment, each atom on a netlist corresponding to a resource on a PLD is examined to determine its criticality using the procedure described.

At 401, the criticality of a component in a system is determined. The criticality of a component may be determined by evaluating the slack on a connection associated with the component. The criticality may be quantified, for example, by the ratio of the slack of the connection to the maximum permissible delay of the connection. Alternatively, criticality may be quantified by the slack value associated with the connection alone, a ratio of the connection's delay and the maximum permissible delay of the connection, or other metrics. A positive slack value for a connection indicates how much delay on the connection in isolation can change before a worst-case path through that connection just meets its timing constraints. A negative slack value for a connection indicates how much the delay on the connection needs to change in order for that connection to meet its timing constraint. According to an embodiment of the present invention, a slack value for a connection may be determined by computing a cumulative delay for the path. The cumulative delay for the path may be computed by summing the estimated delays (achievable delays) for transmitting a signal between the functional blocks on the path. The cumulative delay for the path is subtracted from the long-path timing constraint of the path to determine a path slack value. The smallest path slack value is the slack value for the connection.

Figure 5:
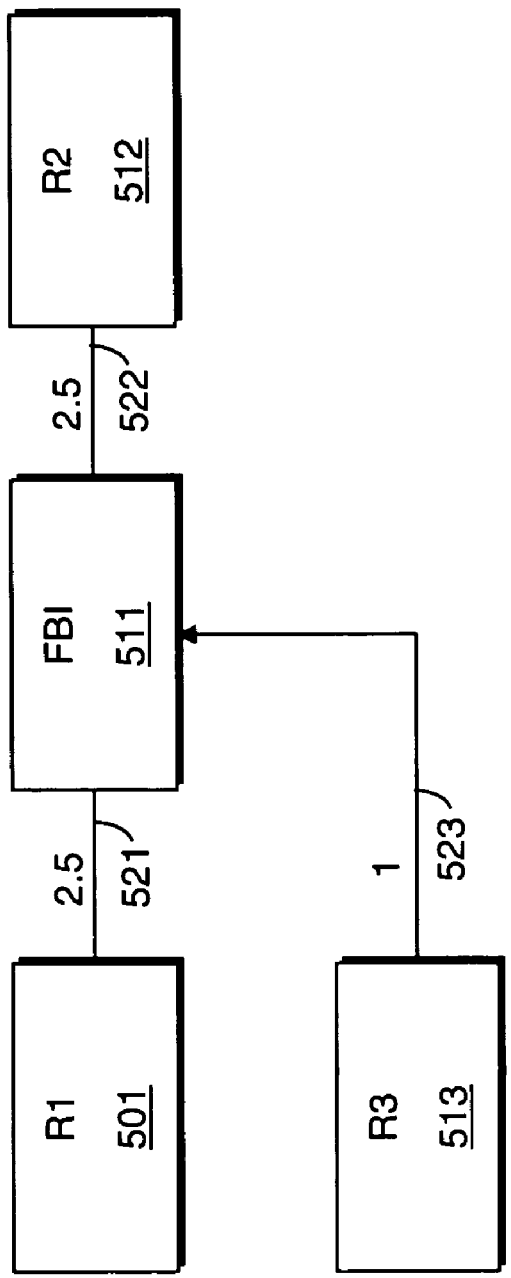
FIG. 5 illustrates an example of how criticality is determined according to an embodiment of the present invention.

FIG. 5 illustrates an example of how slack values are generated. In this example, a first path passes from register R1 510 to functional block FB1 511 to register R2 512. A second path passes from register R3 513 to functional block FB1 511 to register R2 512. A long-path timing constraint of 10 ns is specified for the first path from R1 510 to R2 512. A long-path timing constraint of 20 ns is specified for the second path from R3 513 to R2 512. The long-path timing constraint may be associated with a FMAX (maximum clocking frequency), TSU (setup time), TCO (clock-to-output time), or other specification.

To determine a slack value for a connection, for each path through the connection, a cumulative delay for the path is computed. This may be computed by summing the achievable delays associated with the connections on the path. The achievable delay for each connection is shown next to the connection. For the first path through R1 510, FB1 511, and R2 512, the cumulative delay is 5 ns. The cumulative delay, 5 ns, is subtracted from the long-path timing constraint for the first path, 10 ns, to determine a path slack of 5 ns. For the second path through R3 513, FB1 511, and R2 512, the cumulative delay is 3.5 ns. The cumulative delay, 3.5 ns, is subtracted from the long-path timing constraint for the path, 20 ns, to determine a path slack value 16.5 ns. The path slack value having the lowest value is the slack value for the connection.

For connection 521 between R1 510 and FB1 511, the path slack value is 5 ns. For connection 522 between FB1 511 and R2 512, the path slack value is 5 ns. For connection 523 between R3 513 and FB1 511, the path slack value is 16.5 ns. It should be appreciated that other types of procedures and techniques may also be used to access the criticality of a component. Referring back to FIG. 4, at 402, it is determined whether the criticality exceeds a first predetermined threshold value. If the criticality does not exceed the first predetermined threshold value, control proceeds to 403. If the criticality exceeds the first predetermined threshold value, control proceeds to 404.

At 403, the component is not duplicated.

At 404, it is determined whether the path delay of the connection associated with the component exceeds a second predetermined threshold value. Path delay may be described as the time required for transmitting a signal on the connection given the current configuration of the system. If the path delay of the connection exceeds the second predetermined threshold value, control returns to 403. If the path delay of the connection does not exceed the second predetermined threshold value, control proceeds to 405.

At 405, the component is designated as a replication candidate.

At 406, a location for placing the duplicate of the replication candidate is determined. According to an embodiment of the present invention, all locations on the target device are considered for a location to place the duplicate. According to an alternate embodiment of the present invention, a search space on the target device is defined to narrow the considered locations. In this embodiment, the search space may be an area proximate to the destination of the critical signal associated with the replication candidate such as a location within the same LAB as the destination of the critical signal. According to an embodiment of the present invention, the location for placing the duplicate is selected without considering whether or not placement at a particular location would result in architectural violations or illegalities.

At 407, the duplicate of the replication candidate is assigned the connection from the replication candidate.

At 408, the criticality of the duplicate of the replication candidate is determined. The criticality of a component may be determined by evaluating the slack on the connections associated with the component. As described in 401, the criticality may be quantified, for example, by the ratio of the slack of the connection to the maximum permissible delay of the connection. Alternatively, criticality may be quantified by the slack value associated with the connection alone, a ratio of the connection's delay and the maximum permissible delay of the connection, or other metrics. In a preferred embodiment of the present invention, the slack values associated with the connections surrounding the duplicate of the replication candidate are compared with the slack values associated with the connections surrounding the component.

At 409, the slack changes of connections surrounding the duplicate replication candidate are compared with the original slack of the connections surrounding the component determined at 401. The comparison determines whether the replication yields an improvement or a positive "slack gain". If the slack gain is negative, control proceeds to 403. If the slack gain is positive, control proceeds to 410.

At 410, gain values are generated for the replication candidate. According to an embodiment of the present invention, gain values are generated in response to the slack gain determined at 409, the criticality of the move from the slack associated with the replication candidate determined at 401, and illegalities associated with placement of the duplicate at the location determined at 406. According to an embodiment of the present invention, illegalities associated with placement of the duplicate may include a high level of congestion at the placement location. According to an embodiment of the present invention, after each atom on the netlist is evaluated using the procedure described with reference to FIG. 4, the gain values generated for the replication candidates are utilized to determine which replication candidates are to be selected for replication. In one embodiment, the replication candidates with the n highest gain values are selected to be replicated. It should be appreciated that n may be any value.

According to an embodiment of the present invention, control proceeds to determine whether an additional connection (fanout) is produced by the component at 401. If no additional fanouts exist, the component is deleted. If an additional connection is driven by the component, the connection is moved to the replicated candidate and the slack on the connection at its original location is compared with the slack on the connection at its new location. If there is a slack gain, the connection is assigned to the replicated candidate.

Referring back to FIG. 1, at 105, incremental placement is performed on duplicates of replicated candidates placed at locations that result in architectural violations or illegalities. The changes to the netlist generated from layout-driven optimization are placed on the layout of the existing system placed at 103. Incremental placement involves evaluating resources on a target device such as LABs that have architectural violations or illegalities from layout-driven optimizations. Incremental placement attempts to perturb the preferred locations as little as possible to ensure that the final placement respects all architectural constraints. Incremental placement attempts to identify non-critical LEs that may be moved from their preferred locations to resolve architectural violations in order that truly critical elements may stay at their preferred locations. Incremental placement may be performed by an incremental placement engine (not shown) in the EDA tool that utilizes incremental placement algorithms.

In performing incremental placement, an architectural description of the target device, A, and a netlist, N(E,C), that includes a set of logic elements, E, and a set of connections, C, is processed. Each element, e, is associated with a preferred physical location, $(p_x(e), p_y(e))$. According to an embodiment of the present invention, all atoms of the netlist have a preferred location. Incremental placement generates a set of mapped locations, M, for each logic elements in N. Incremental placement tries to find a mapping from preferred locations to mapped locations, P→M, such that the mapped locations are architecturally feasible as well as being minimally disruptive. The definition of minimal disruption depends on the goal of netlist optimization.

According to an embodiment of the present invention, the goal of netlist optimization is to optimize timing of the system. In this embodiment, T(S) represent an estimate of the critical path delay if all logic elements in E are mapped to $(s_x(e), s_y(e))$. The estimate may ignore the legality of locations and may be computed assuming a best case route is possible for each connection. In this example, P→M is minimally disruptive if incremental placement minimizes {T(M)−T(P)}. Any logic element can be moved from its preferred location as long as it does not degrade the critical path. According to one embodiment, routing area is also tracked to control excessive routing congestion. In this embodiment, A(S) represents the routing area consumed if the logic elements are mapped to $(s_x(e), s_y(e))$. Minimal disruptiveness is satisfied by minimizing the relationships shown below.

$${T(M)-T(P)}+{A(M)-A(P)} \qquad (1)$$

Figure 6:
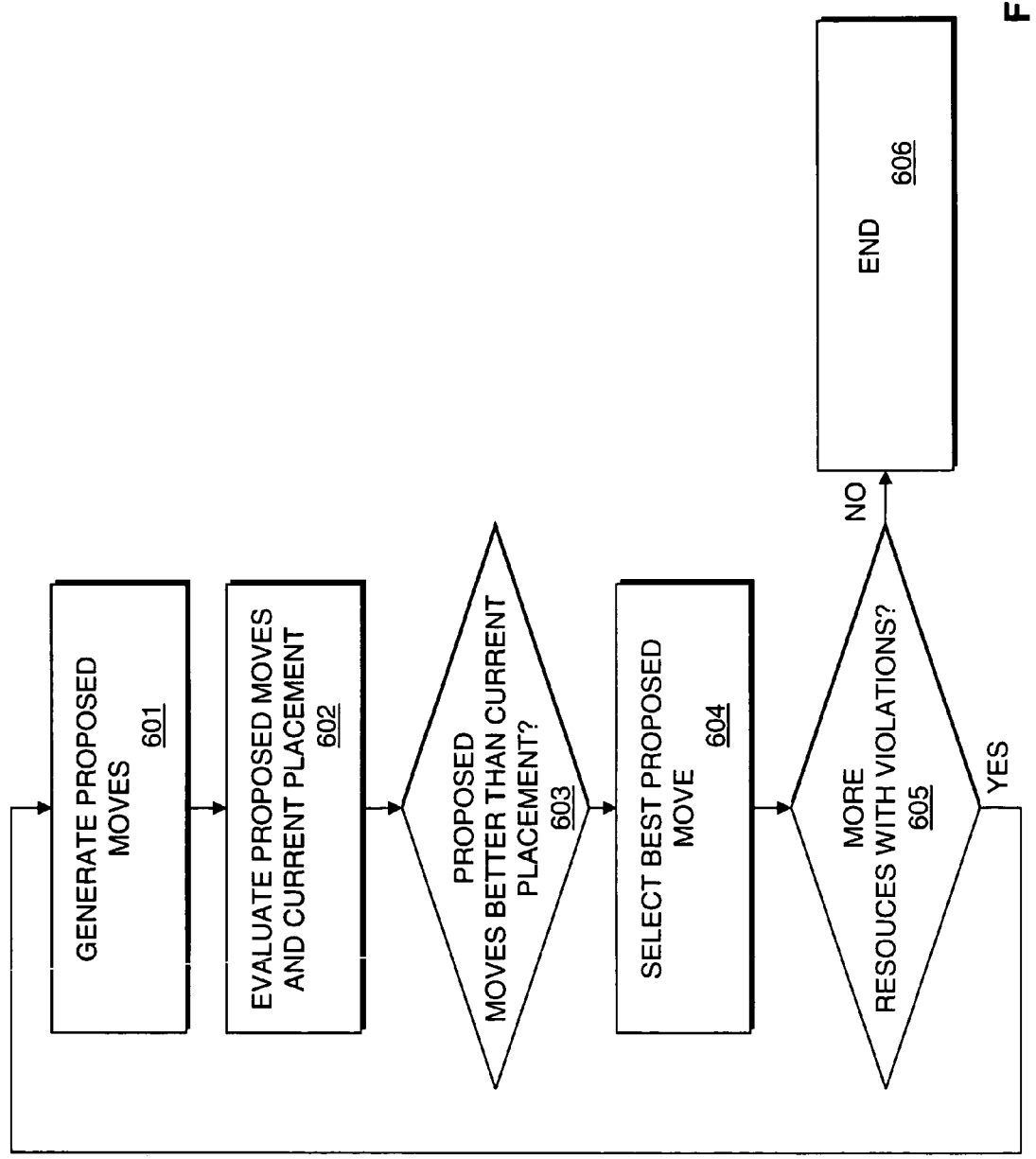
FIG. 6 is a flow chart illustrating a method for performing incremental placement according to an embodiment of the present invention.

FIG. 6 is a flow chart illustrating a method for performing incremental placement according to an embodiment of the present invention. The method described in FIG. 6 may be used to perform incremental placement as shown as 105 in FIG. 1. At 601 proposed moves for all LEs in a LAB having architectural violations are generated. According to an embodiment of the present invention, proposed moves may include a move-to-fanin, move-to-fanout, move-to-sibling, move-to-neighbor, move-to-space, a move towards a critical vector, and other moves. A move-to-fanin involves moving an LE to a LAB that is a fanin of the LE. A move-to-fanout involves moving an LE to a LAB that is a fanout of the LE. A move-to-sibling involves moving an LE to a LAB that is fanout of a LAB that fans in to the LAB of the LE.

Figure 7:
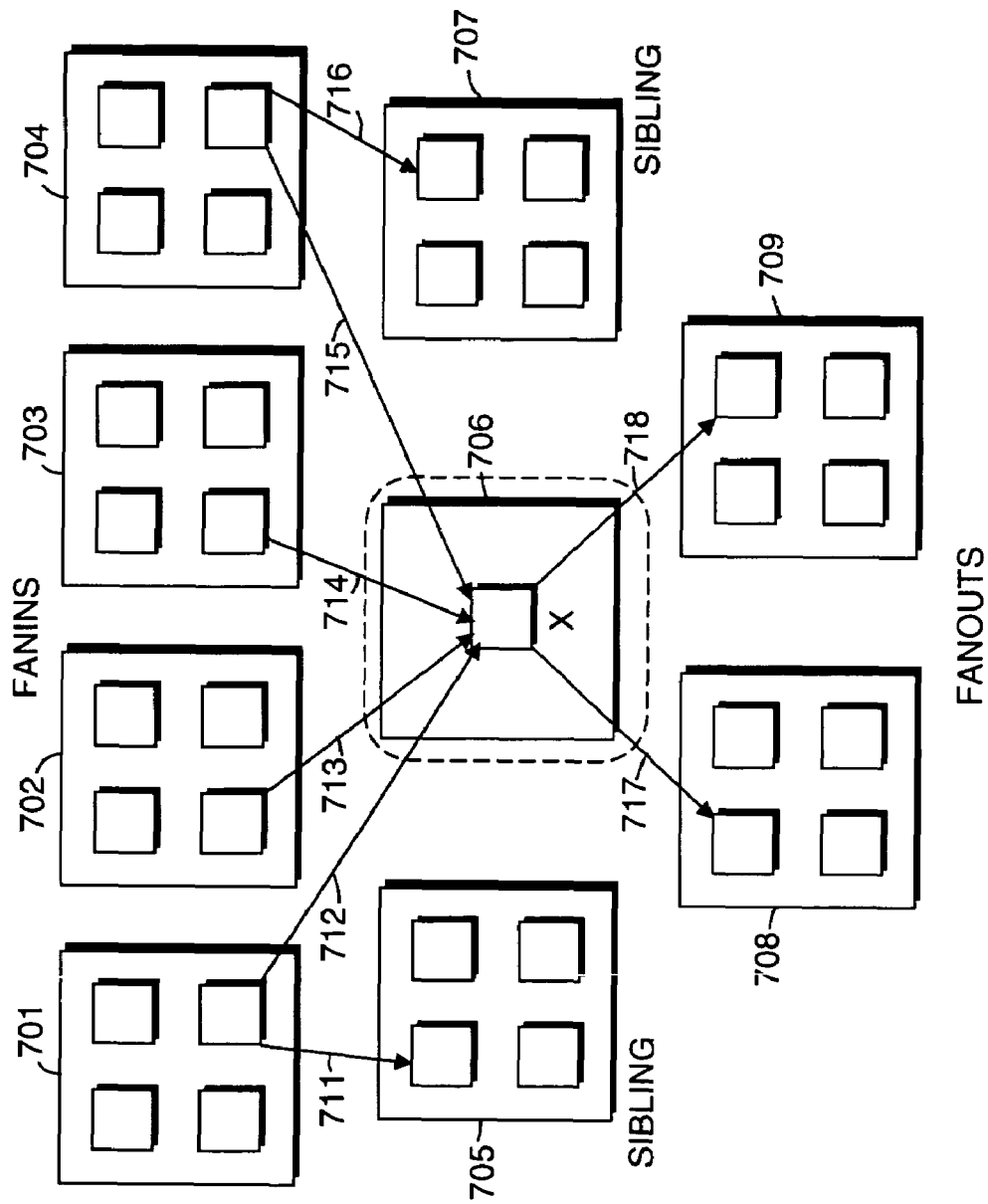
FIG. 7 illustrates fanin, fanout, and sibling relationship move proposals according to an embodiment of the present invention.

FIG. 7 illustrates examples of a move-to-fanin, move-to-fanout, and move-to-sibling. When a first LE in a first LAB transmits a signal to a second LE in a second LAB, the first LAB is said to be a fanin of the second LE. When a first LE in a first LAB receives a signal from a second LE in a second LAB, the first LAB is said to be a fanout of the second LE. When a first LE from a first LAB receives a signal from a second LE from a second LAB that also transmits to a third LE in a third LAB, the first LAB and the third LABs are said to be siblings. Blocks 701-709 illustrates a plurality of LABs. Each of the LABs 701-709 has a number of shown LEs. A plurality of arrows 711-718 are shown to illustrate the direction of a signal transmitted between LEs. Relative to LAB 706, LABs 701-704 are considered fanins, LABs 705 and 707 are considered siblings, and LABs 708 and 709 are considered fanouts.

Figure 8:
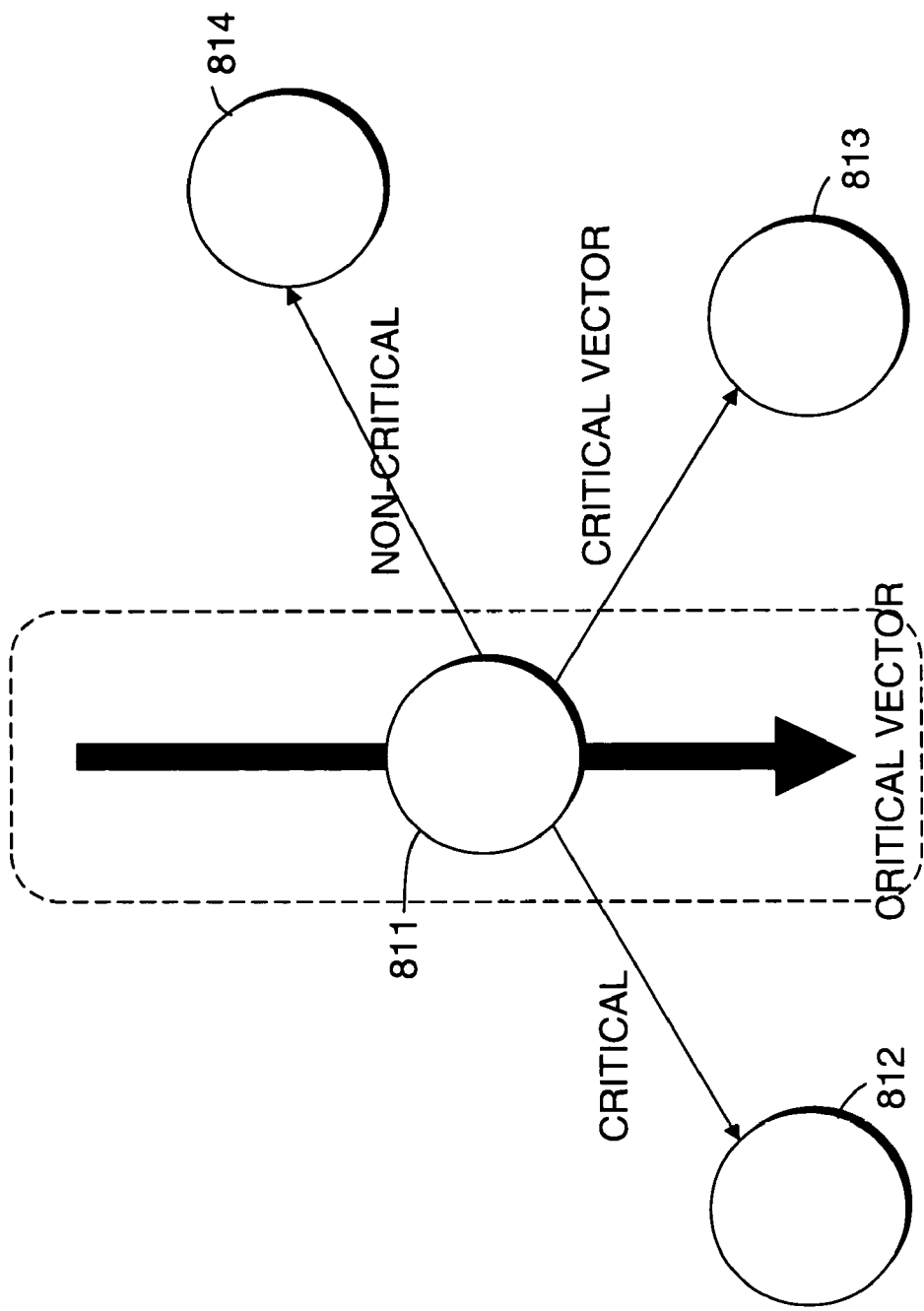
FIG. 8 illustrates an exemplary critical vector move proposal according to an embodiment of the present invention.

Proposed moves may also include move-to-neighbor, move-to-space, and move towards critical vector. A move-to-neighbor involves moving an LE to an adjacent LAB. A move-to-space involves a move to any random free LE location in a target device. A move towards critical vector involves moving an LE towards a vector that is computed by summing the directions of all critical connections associated with the moving LE. FIG. 8 illustrates an exemplary critical vector 801. Vector 801 is the critical vector of LE 811 which has critical connections to LEs 812 and 813, and a non-critical connection with LE 814.

Referring back to FIG. 6, at 602, a current placement of LEs in a LAB with architectural violations and proposed moves of the LEs in the LAB are evaluated by a cost function. The cost function may include parameters which measure the legality of a LAB (cluster legality cost), timing (timing cost), and an amount of routing resources that is required for a placement (wirelength cost). According to an embodiment of the present invention, the cost function guides the reduction of architectural violations while ensuring minimal disruption. This cost function, C, is illustrated with the relationship shown below.

$$C = K_L * \text{ClusterCost} + K_T * \text{TimingCost} * K_W * \text{WirelengthCost} \quad (2)$$

$K_L$, $K_T$, and $K_W$ represent weighting coefficients that normalize the contributions of each parameter. It should be appreciated that other parameters may be used in addition to or in place of the parameters described.

The cluster legality cost is a cost associated with each LAB $CL_i$. This cost may be represented as shown below.

$$\begin{aligned}\text{ClusterCost}(CL_i) = \ & kE_i * \text{legality}(CL_i, n_E) + \\ & KI_i * \text{legality}(CL_i, n_I) + \\ & kR_i * \text{legality}(CL_i, n_R) + \\ & kO_i * \text{legality}(CL_i, n_O) + \\ & kC_i * \text{legality}(CL_i, n_C)\end{aligned} \quad (3)$$

The legality ($CL_i$, ...) function returns a measure of legality for a particular constraint. A value of 0 indicates legality, while any positive value is proportional to the amount to which the constraint has been violated. Functions legality ($CL_i$, $n_E$), legality ($CL_i$, $n_I$), legality ($CL_i$, $n_O$), legality ($CL_i$, $n_R$), and legality ($CL_i$, $n_C$) evaluate if LAB $CL_i$ has a feasible number of logic elements, inputs, outputs, reset lines and clock lines, respectively. According to an embodiment of the present invention, the weighting coefficients $kE_i$, $KI_i$, $kO_i$, $kR_i$, and $kC_I$ are all initially set to 1 for every LAB $CL_i$ in the target device.

The timing cost associated with a placement may be represented as shown below.

$$\text{TimingCost} = TC_{VPR} + k_{DAMP} * TC_{DAMP} \quad (4)$$

The first parameter, $TC_{VPR}$, is based upon the cost used by a versatile placement and routing (VPR) placer. This cost may be represented with the following relationship.

$$TC_{VPR} = \Sigma_c \text{crit}(c) * \text{delay}(c) \quad (5)$$

This function encourages critical connections to reduce delay while allowing non-critical connections to optimize wirelength and other optimization criteria.

The second parameter, $TC_{DAMP}$, operates as a damping component of the timing cost function and can be represented with the following relationships.

$$TC_{DAMP} = \Sigma_c \max(\text{delay}(c) - \text{maxdelay}(c), 0.0) \quad (6)$$

$$\text{maxdelay}(c) = \text{delay}(c) + \alpha * \text{slack}(c) \quad (7)$$

The damping component penalizes any connection c whose delay(c) exceeds a maximum value maxdelay(c). This allows arbitrary moves to be made along a plateau defined by the maximum delays. The maxdelay values may be updated every time a timing analysis of the system is executed. The maxdelay values are controlled by the slack on the connection considered. The parameter α determines how much of a connection's slack will be allocated to the delay growth of the connection. Thus, the plateau is defined by the connection slack so that connection with large amounts of slack are free to move large distances in order to resolve architectural violations, while small slack values are relatively confined.

Figure 9:
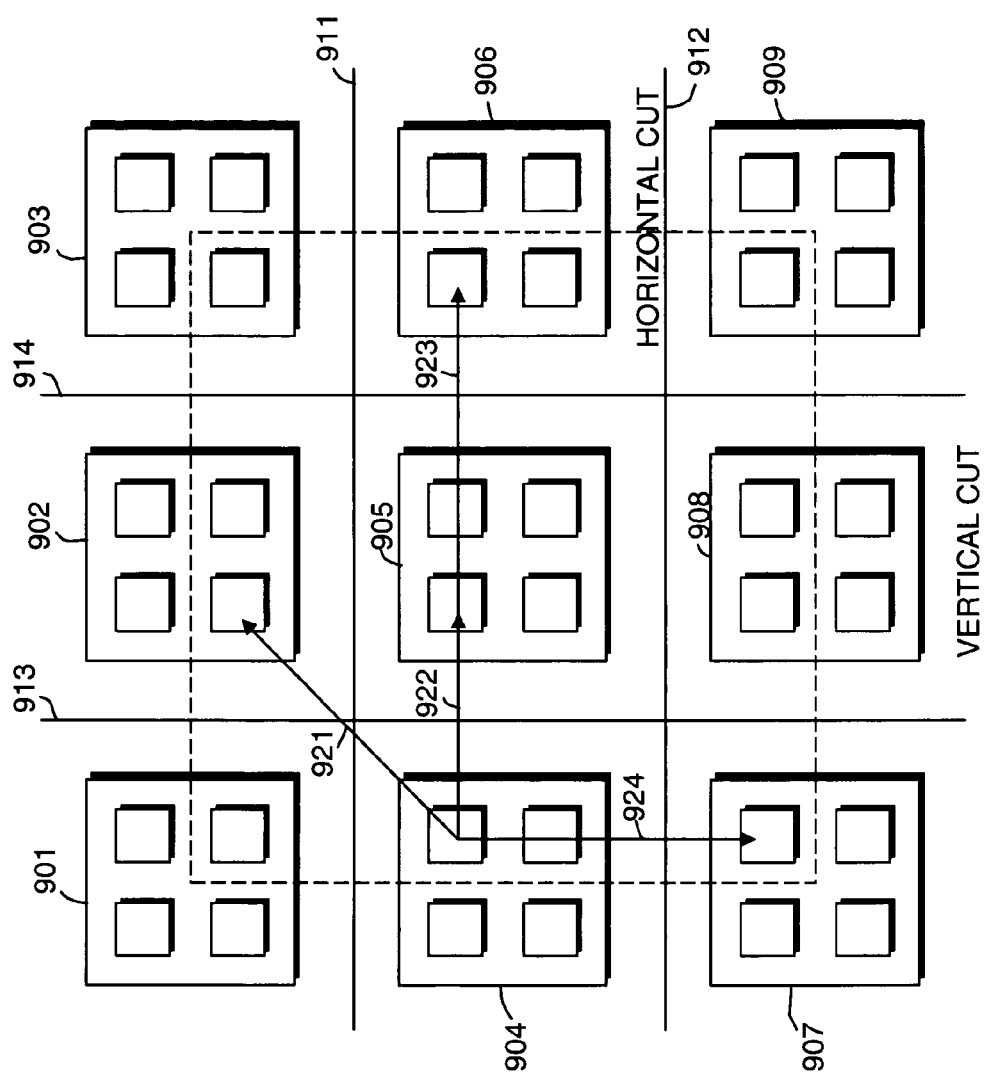
FIG. 9 illustrates horizontal and vertical cut-lines used for local congestion estimation according to an embodiment of the present invention.

Wirelength cost of a placement may be measured by determining a number of routing wires that cross cut-lines that outline a LAB. FIG. 9 illustrates the utilization of cut-lines according to an embodiment of the present invention. Blocks 901-909 represent LABs having a plurality of shown LEs. Horizontal cut-lines 911 and 912 and vertical cut-lines 913 and 914 are placed in each horizontal channel of a target device. Cut-lines provide a method to measure congestion by finding the regions that have the largest number of routing wires 921-924. This measurement may be used to prevent the formation of localized congested areas that can cause circuitous routes. The total number of routing wires that intersect a particular cut may be calculated by finding all the signals that intersect a particular cut-line and summing the average crossing-count for each of these signal wires. The average crossing count for a signal may be computed using the following relationship.

$$\text{CrossingCount}(\text{net}) = q(\text{Num}CL\text{BlockPins}(\text{net})) \quad (8)$$

The function q is given as a number of discrete crossing counts as a function of signal pin count. The argument to the function q is the number of clustered logic block pins used to wire the signal. With respect to the functions shown in (3)-(8), it should be appreciated that other types of functions may be used in addition or in place of the functions represented.

Referring back to FIG. 6, at 603, it is determined whether the cost associated with any of the proposed moves is better than the cost associated with the current placement. The costs associated with the proposed moves and current placement may be obtained by using cost function values generated from using the cost function described with respect to 602. If it is determined that the cost associated with any of the proposed moves is better than the cost associated with the current placement, control proceeds to 604. If it is determined that the cost associated with any of the proposed moves is not better than the cost associated with the current placement, control proceeds to 605.

At 604, the proposed move associated with the best cost is selected as the current placement.

At 605, it is determined whether any additional LABs in the system have architectural violations. If additional LABs in the system have architectural violations, control will move to one of these LABs and proceeds to 601. If no additional LABs in the system have architectural violations, control proceeds to 606 and terminates the procedure. According to an embodiment of the present invention, a counter may be used to track the number of proposed moves that have been generated, or the number of LEs or LABs that have had proposed moves generated. In this embodiment, when this number exceeds a threshold value, instead of proceeding to 601, control terminates the procedure and returns an indication that a fit was not found.

Figure 10:
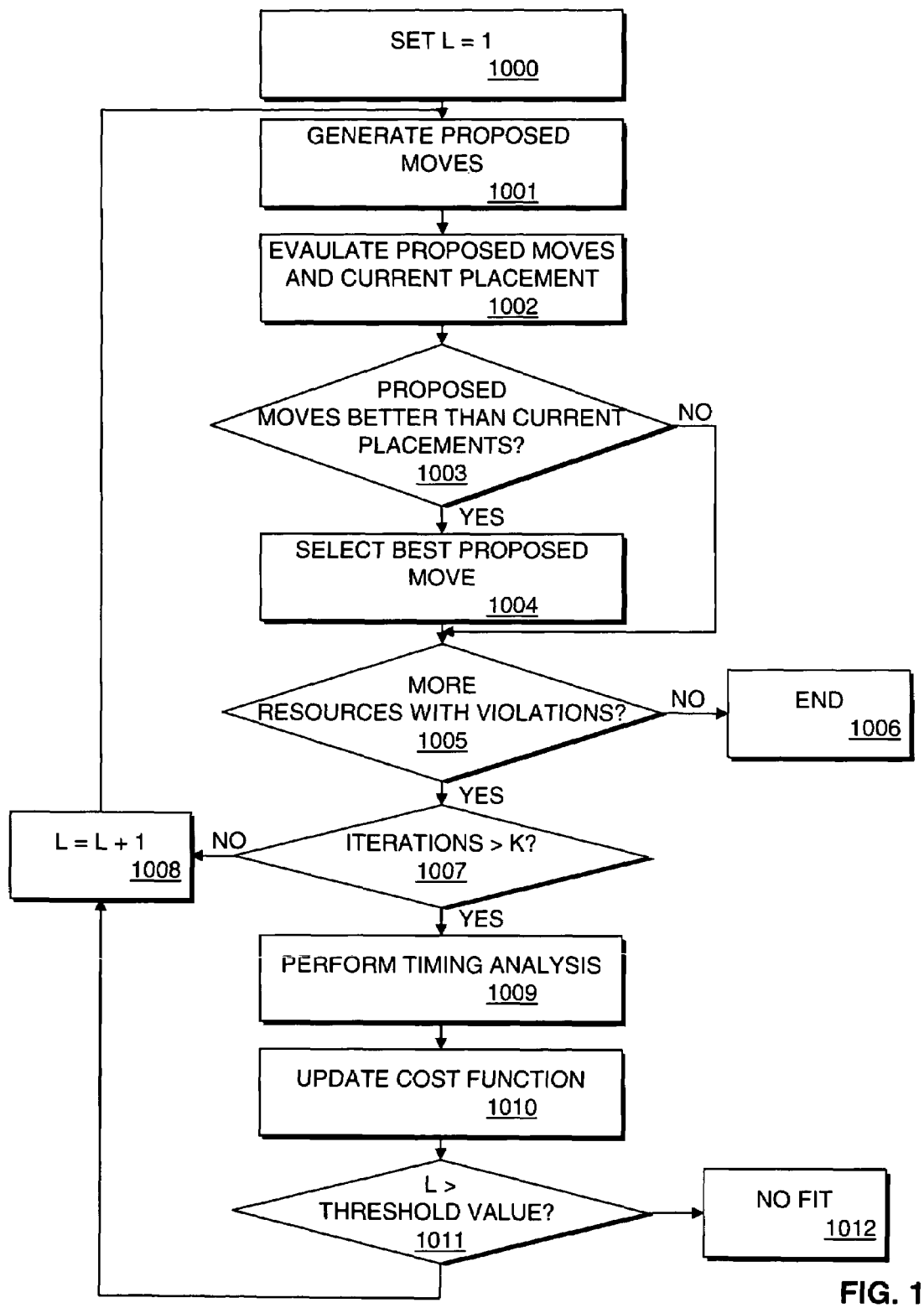
FIG. 10 is a flow chart illustrating a method for performing incremental placement utilizing directed hill-climbing according to an embodiment of the present invention.

FIG. 10 is a flow chart illustrating a method for performing incremental placement utilizing directed hill-climbing according to an embodiment of the present invention. The method described in FIG. 10 may be used to perform incremental placement as shown as 105 in FIG. 1. At 1000, a loop iteration index, L, is set to 1.

At 1001 proposed moves for all LEs in a LAB having architectural violations are generated. According to an embodiment of the present invention, the proposed moves may be generated similarly as described in 601 shown in FIG. 6. The number of LEs having proposed moves generated is recorded.

At 1002, a current placement of LEs in a LAB with architectural violations and proposed moves of the LEs in the LAB are evaluated by a cost function. According to an embodiment of the present invention, the evaluation performed may be similarly conducted as described in 602 of FIG. 6.

At 1003, it is determined whether the cost associated with any of the proposed moves is better than the cost associated with the current placement. The costs associated with the proposed moves and current placement may be obtained by using values generated from using the cost function described with respect to 602. If the cost associated with any of the proposed moves is better than the cost associated with the current placement, control proceeds to 1004. If the cost associated with any of the proposed moves is not better than the cost associated with the current placement, control proceeds to 1005.

At 1004, the proposed move associated with the best cost is selected as the current placement.

At 1005, it is determined whether any additional LABs in the system have architectural violations. If additional LABs in the system have architectural violations, control will move to one of these LABs and proceeds to 1007. If no additional LABs in the system have architectural violations, control proceeds to 1006 and terminates the procedure.

At 1007, it is determined whether the number of LEs that have proposed moves generated exceeds the value K where K is a predefined value. If the number of LEs that have proposed moves generated exceeds the value K, control proceeds to 1009. If the number of LEs that have proposed moves generated does not exceed the value K, control proceeds to 1008.

At 1008, the loop iteration index, L, is incremented. Control returns to 1001.

At 1009, timing analysis is performed. According to an embodiment of the present invention, the values for maxdelay and crit(c), used for evaluating timing cost, are updated to reflect the current configuration of the system.

At 1010, the cost function is updated. According to an embodiment of the present invention, weighting coefficients in the ClusterCost parameter are incremented in proportion to an amount of violation. Updating the cost function allows directed hill-climbing to be performed.

Directed hill-climbing is a technique that is used for generating proposed moves when moves cannot be found to decreases the current cost of a placement.

Figure 11:
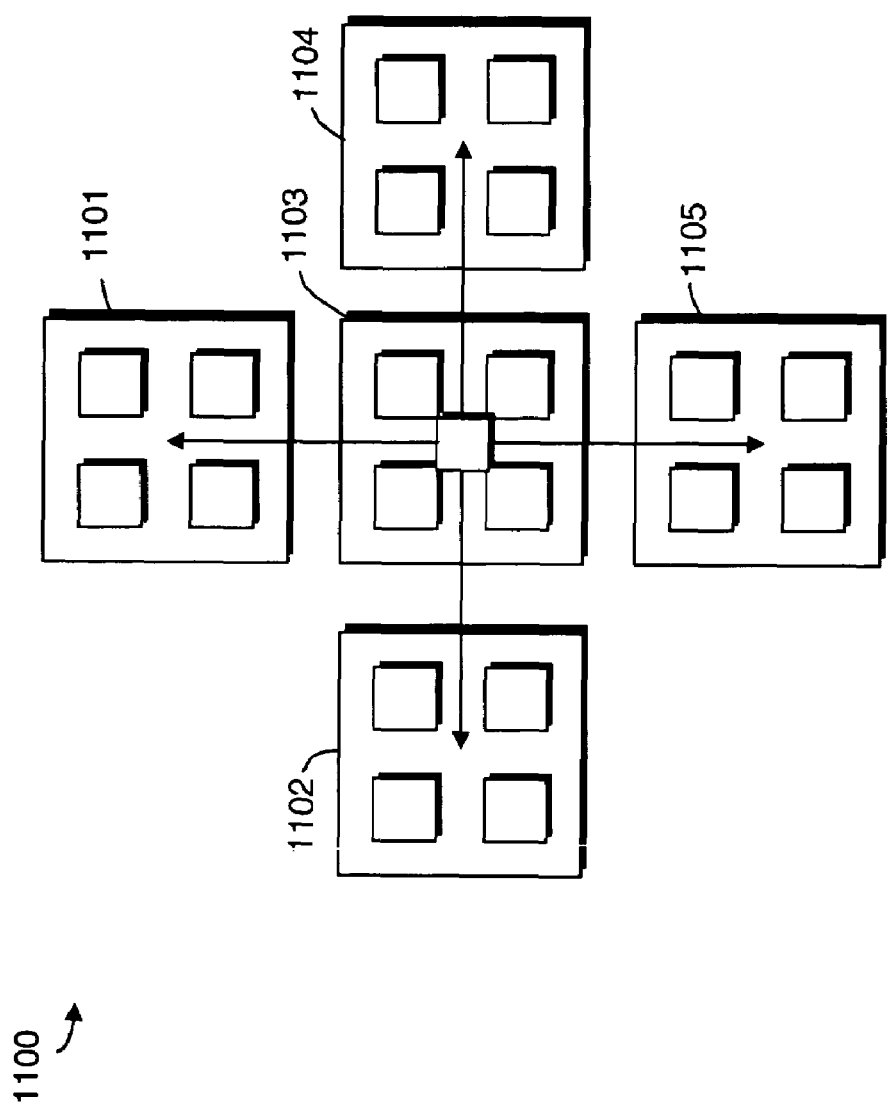
FIG. 11 illustrates a component trapped in a local minima according to an embodiment of the present invention.

FIG. 11 illustrates an example where directed hill-climbing may be applied. The target device 1100 includes a plurality of LABs 1101-1105 each having a plurality of shown LEs. In this example, LAB 1103 has one LE more than is allowed by its architectural specification. Every possible move attempt to resolve the architectural constraints of the center LAB 1103 results in another architectural violation. If all architectural violations are costed in the same manner, then the method described in FIG. 6 may have difficulties resolving the constraint violation.

Figure 12:
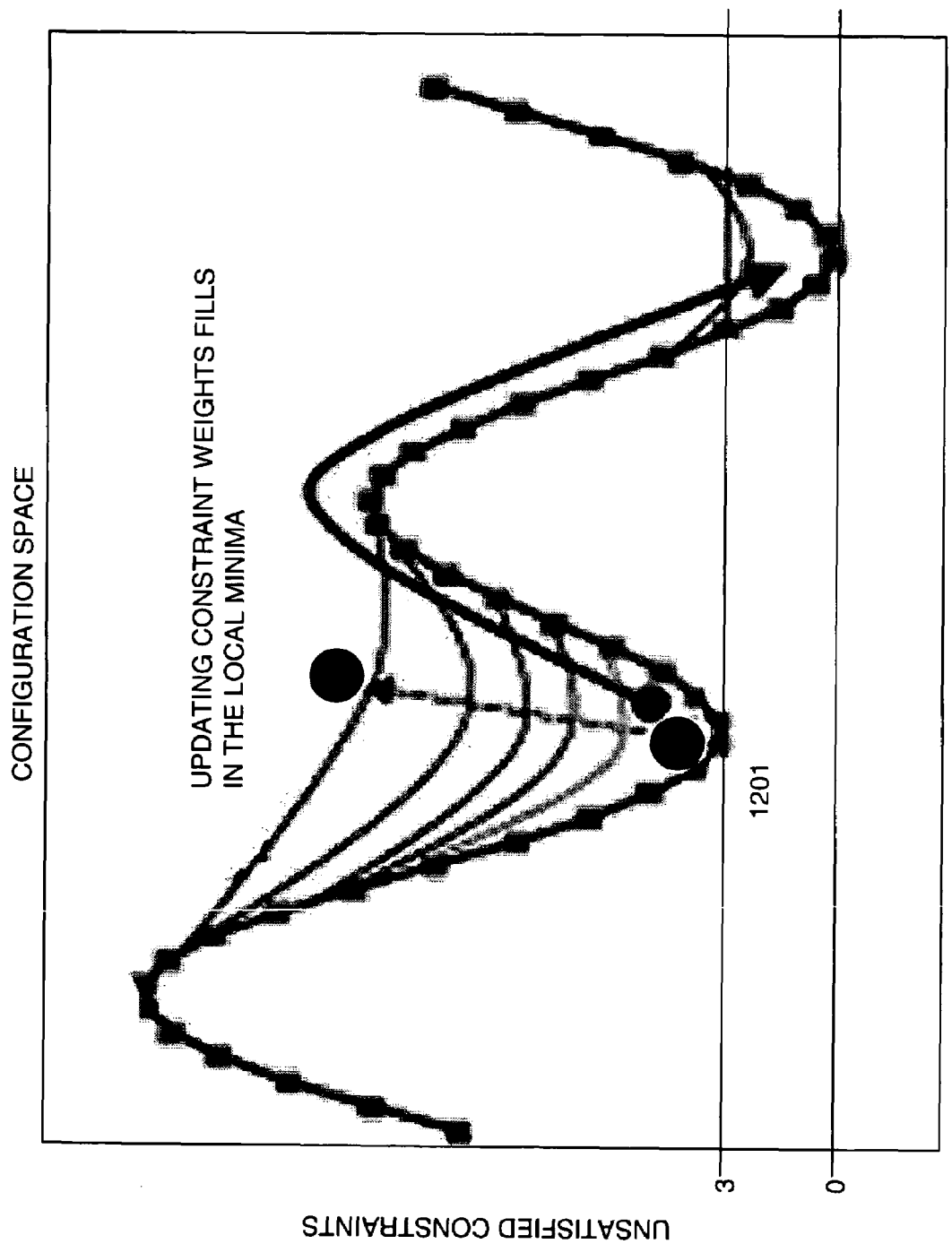
FIG. 12 illustrates basin-filling according to an embodiment of the present invention.

FIG. 12 illustrates a two dimensional slice of the multi-dimensional cost function described. The current state 1201 represents the situation shown in FIG. 11. No single move in the neighborhood of the current state finds a solution with a lower cost. However, the cost function itself could be modified to allow for the current state 1201 to climb the hill. The weighting coefficients of the cost function may be gradually increased for LABs that have unsatisfied constraints. A higher weight may be assigned to unsatisfied constraints that have been violated over a long period of time or over many iterations. This results in the cost function being reshaped to allow for hill climbing. The reshaping of the cost function has the effect of filling a basin where the local minima is trapped. Referring back to FIG. 11, once the weighting coefficients have been increased for LAB 1103, a proposed move to one of the adjacent cluster may be made to allow for shifting the violation "outwards" to a free space.

Updating a cost function also allows for a quick convergence by preventing a phenomenon known as thrashing. Thrashing occurs when incremental placement is trapped in an endless cycle where an LE is moved between two points in the configuration space which both result in architectural violations. By increasing the cost or penalty for moving to the two points, a move to a third point would eventually be more desirable and accepted.

Referring back to FIG. 10, at 1011, it is determined whether the loop index, L, is greater than a threshold value. If the loop index, L, is not greater than the threshold value, control proceeds to 1008. If the loop index, L, is greater than the threshold value, control proceeds to 1012.

At 1012, control terminates the procedure and returns an indication that a fit was not found.

Referring back to FIG. 1, at 106 it is determined whether additional optimization is to be performed. According to an embodiment of the present invention, a count is maintained as to how many times the procedure at 104 is performed. If the count does not exceed a predefined threshold number, control returns to 104. If the count exceeds the predefined threshold number, control proceeds to 107.

Figure 13:
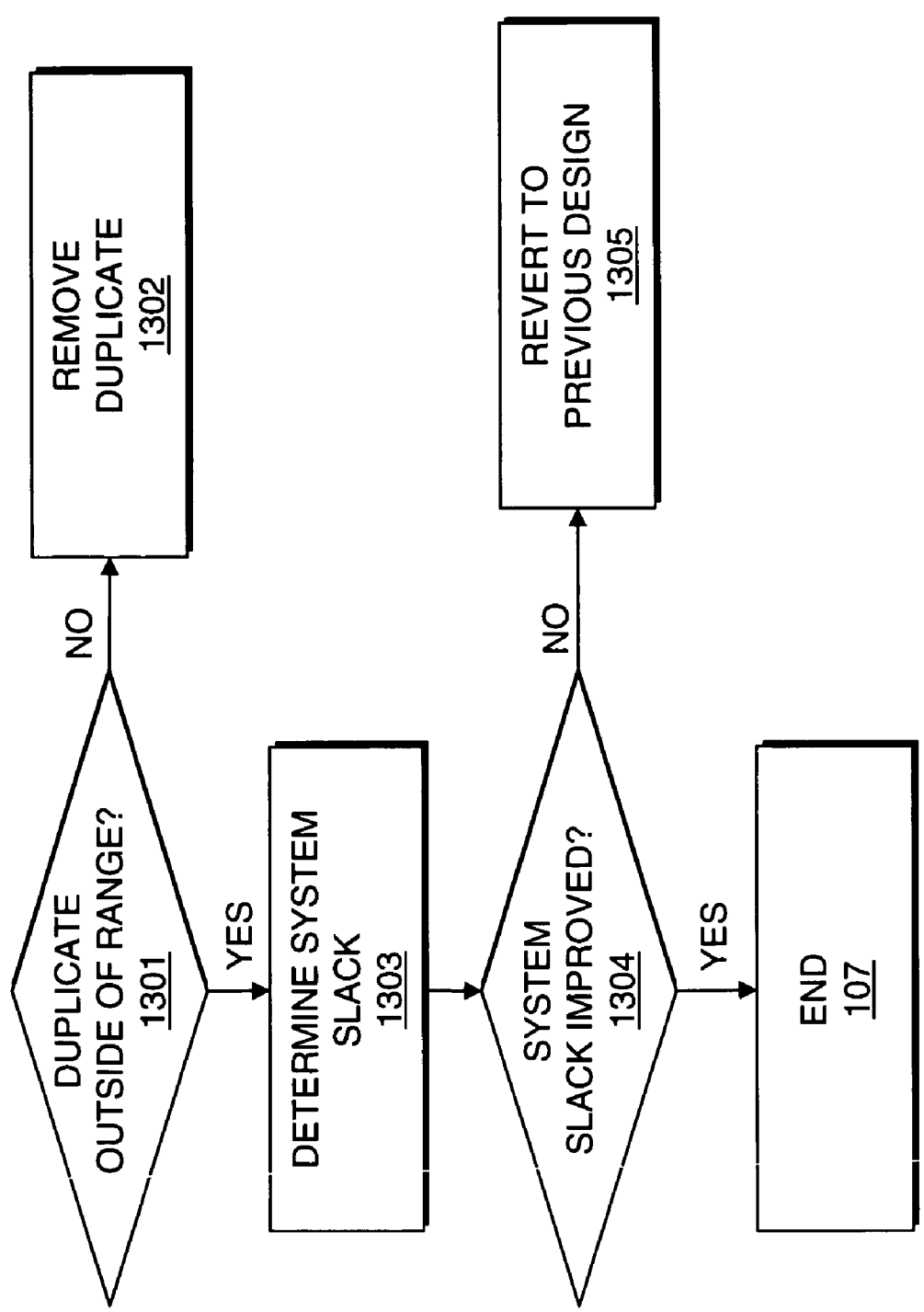
FIG. 13 is a flow chart illustrating a method for managing duplicated components according to an embodiment of the present invention.

According to an embodiment of the present invention, additional procedures may be performed on system. FIG. 13 is a flow chart illustrating a method for managing duplicated components according to an embodiment of the present invention. At 1301, it is determined whether a duplicate has been placed outside a predefined range from its corresponding replication candidate. According to one embodiment, the predefined range may be, for example, a distance of a logic-array block. If the duplicate is within the range, control proceeds to 1302. If the duplicate is place outside the range, control proceeds to 1303.

At 1302, the duplicate is removed and the connection associated with the duplicate is restored to the replication candidate.

At 1303, the system slack for the current design is determined. According to an embodiment of the present invention, the system slack for the current design reflects the overall slack of the current design.

At 1304, it is determined whether the system slack for the current design is an improvement over the previous design. If the system slack for the current design is not an improvement over the previous design, control proceeds to 1305. If the system slack for the current design is an improvement over the previous design, control terminates the procedure as shown at 1306.

At 1305, the previous design for the system is restored. According to an embodiment of the present invention, the netlist and placement for each design is saved before performing the procedure at 104 to allow the previous design to be restored.

Referring back to FIG. 1, at 107, routing of the system is performed. During routing, routing resources on the target device are allocated to provide interconnections between logic gates, logic elements, and other components on the target device. The routing procedure may be performed by a router in an EDA tool that utilizes routing algorithms. According to an alternate embodiment of the present invention, it should be appreciated that the procedures with reference to 104-106 may also be performed after the routing described with reference to 107.

The incremental placement techniques disclosed allow logic changes to be incorporated into an existing system design without reworking placement of the entire system. The incremental placement techniques attempt to minimize disruption to the original placement and maintain the original timing characteristics. According to an embodiment of the present invention, a method for designing a system on a target device utilizing FPGAs is disclosed. The method includes placing new LEs at preferred locations on a layout of an existing system. Illegalities in placement of the components are resolved. According to one embodiment, resolving the illegalities in placement may be achieved by generating proposed moves for an LE, generating cost function values for a current placement of the LE and for placements associated with the proposed moves, and accepting a proposed move if its associated cost function value is better than the cost function value for the current placement.

FIGS. 1, 6, 10 and 13 are flow charts illustrating methods according to embodiments of the present invention. Some of the techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

Embodiments of the present invention (e.g. exemplary process described with respect to FIGS. 1, 4, and 5) may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for designing a system on a target device utilizing field programmable gate arrays (FPGAs), comprising:
   synthesizing a design for the system;
   mapping components in the design onto resources on the target device;
   determining placement locations for the components on the target device;
   identifying components to replicate in response to criticality determined from the placement locations;
   duplicating the components to replicate;
   determining placement locations for duplicates of the components to replicate to be placed on the target device together with the components to replicate; and
   saving the placement locations.

2. The method of claim 1, wherein identifying components to replicate comprises identifying a replication candidate with associated slack that exceeds a threshold value.

3. The method of claim 2, further comprising determining a location for a duplicate of the replication candidate.

4. The method of claim 3, further comprising determining slack gain associated with the duplicate of the replication candidate at the location.

5. The method of claim 4, further comprising computing a gain value for the duplicate of the replication candidate.

6. The method of claim 5, wherein computing the gain value comprising evaluating stack gain, the associated slack of the replication candidate, and illegalities associated with placement at the location.

7. The method of claim 5, further comprising designating n components with a highest gain value as the components to replicate.

8. The method of claim 1, wherein determining placement locations comprises performing incremental placement on duplicates of the components to replicate.

9. The method of claim 8, further comprising:
   identifying additional components to replicate; and
   performing incremental placement on the duplicates of the additional components to replicate.

10. The method of claim 8, further comprising routing the components and the duplicates of the components to replicate.

11. The method of claim 8, further comprising determining system slack for the system.

12. The method of claim 11, further comprising restoring the system to its previous design if the system slack has decreased.

13. The method of claim 1, further comprising removing a duplicate if a location of the duplicate is in a logic array block with its corresponding component to replicate.

14. The method of claim 1, wherein identifying components to replicate comprises identifying a replication candidate with associated path delay that exceeds a threshold value.

15. A method for designing a system on a target device utilizing field programmable gate arrays (FPGAs), comprising:
   determining placement locations for components on the target device;
   identifying components to replicate in response to criticality determined from the placement locations; and
   performing incremental placement to resolve an illegality in placement of a duplicate of a component to replicate together with the component to replicate on the target device.

16. The method of claim 15, wherein identifying components to replicate comprises identifying a replication candidate with associated slack that exceeds a threshold value.

17. The method of claim 16, further comprising determining a location for a duplicate of the replication candidate.

18. The method of claim 17, further comprising determining slack gain associated with the duplicate of the replication candidate at the location.

19. The method of claim 18, further comprising computing a gain value for the duplicate of the replication candidate.

20. The method of claim 19, wherein computing the gain value comprising evaluating slack gain, the associated slack of the replication candidate, and illegalities associated with placement at the location.

21. The method of claim 19, further comprising designating n components with a highest gain value as the components to replicate.

22. The method of claim 15, wherein performing incremental placement to resolve illegalities in placement of the duplicates of the components to replicate comprises:

generating a proposed move for the duplicate;

generating cost function values for a current placement with the proposed move; and accepting the proposed move if its associated cost function value is better than the cost function value of the current placement.

23. The method of claim 22, wherein generating the proposed move comprises moving the duplicate to a logic-array block (LAB) that is a fanin of the duplicate.

24. The method of claim 22, wherein generating the proposed move comprises moving the duplicate to a logic-array block (LAB) that is a fanout of the duplicate.

25. The method of claim 22, wherein generating the proposed move comprises moving the duplicate to a logic-array block (LAB) that is a sibling of a LAB where the duplicate resides.

26. The method of claim 22, wherein generating the proposed move comprises moving the duplicate to a logic-array block (LAB) that is adjacent to the duplicate.

27. A machine-readable medium having stored thereon sequences of instructions, the sequences of instructions including instructions which, when executed by a processor, causes the processor to perform:

synthesizing a design for a system;

mapping components in the design onto resources on a target device;

determining placement locations for the components on the target device;

identifying components to replicate in response to criticality determined from the placement locations;

duplicating the components to replicate;

determining placement locations for duplicates of the components to replicate to be placed on the target device together with the components to replicate; and saving the placement locations.

28. The machine-readable medium of claim 27, wherein identifying components to replicate comprises identifying a replication candidate with associated slack that exceeds a threshold value.

29. The machine-readable medium of claim 28, further comprising instructions which when executed further performs determining a location for a duplicate of the replication candidate.

30. The machine-readable medium of claim 29, further comprising instructions which when executed further performs determining slack gain associated with the duplicate of the replication candidate at the location.

31. The machine-readable medium of claim 30, further comprising instructions which when executed further performs computing a gain value for the duplicate of the replication candidate.

32. The machine-readable medium of claim 31, wherein computing the gain value comprising evaluating slack gain, the associated slack of the replication candidate, and illegalities associated with placement at the location.

33. The machine-readable medium of claim 31, further comprising instructions which when executed further performs designating n components with a highest gain value as the components to replicate.

34. The machine-readable medium of claim 27, wherein determining placement locations comprises performing incremental placement on duplicates of the components to replicate.

* * * * *